(12) United States Patent
Zmuda et al.

(10) Patent No.: US 10,516,409 B2
(45) Date of Patent: Dec. 24, 2019

(54) HIGH-SPEED, HIGH-RESOLUTION, PHOTONIC-BASED ANALOG-TO-DIGITAL CONVERTER

(71) Applicant: UNIVERSITY OF FLORIDA RESEARCH FOUNDATION, INCORPORATED, Gainesville, FL (US)

(72) Inventors: Henry Zmuda, Newberry, FL (US); Nickolas P. Dirocco, Gainesville, FL (US)

(73) Assignee: University of Florida Research Foundation, Incorporated, Gainesville, FL (US)

(*) Notice: Subject to any disclaimer, the term of this patent is extended or adjusted under 35 U.S.C. 154(b) by 0 days.

(21) Appl. No.: 16/079,838

(22) PCT Filed: Feb. 24, 2017

(86) PCT No.: PCT/US2017/019345
§ 371 (c)(1),
(2) Date: Aug. 24, 2018

(87) PCT Pub. No.: WO2017/147416
PCT Pub. Date: Aug. 31, 2017

(65) Prior Publication Data
US 2019/0074844 A1   Mar. 7, 2019

Related U.S. Application Data

(60) Provisional application No. 62/300,723, filed on Feb. 26, 2016.

(51) Int. Cl.
*H03M 1/44*    (2006.01)
*G02F 7/00*    (2006.01)

(52) U.S. Cl.
CPC ............... *H03M 1/44* (2013.01); *G02F 7/00* (2013.01); *H04B 2210/006* (2013.01)

(58) Field of Classification Search
CPC ........................................................ G02F 7/00
See application file for complete search history.

(56) References Cited

U.S. PATENT DOCUMENTS

| | | | | |
|---|---|---|---|---|
| 6,064,325 A * | 5/2000 | Fields | ....................... | G02F 7/00 341/137 |
| 8,941,519 B2 * | 1/2015 | Sato | ....................... | G02F 1/2255 341/130 |

(Continued)

OTHER PUBLICATIONS

WIPO Application No. PCT/US2017/019345, International Search Report and Written Opinion of the International Searching Authority, dated May 11, 2017.

(Continued)

*Primary Examiner* — Howard Williams
(74) *Attorney, Agent, or Firm* — Alston & Bird LLP

(57) ABSTRACT

A photonic feedforward analog-to-digital converter (ADC) is provided. According to one aspect of the invention, the signal to be digitized is applied to only one electro-optic modulator. High speed is achieved by taking advantage of the fundamental property of a Pockels Cell to control wave polarization using the electro-optic effect. In a further aspect, once a bit is determined, its state is fed forward to the next least significant bit to aid in determination of the next lower bit. This nonlinear feedforward aspect of the ADC provides simplicity of its architecture.

18 Claims, 5 Drawing Sheets

(56) References Cited

U.S. PATENT DOCUMENTS

| | | |
|---|---|---|
| 9,091,593 B2* | 7/2015 | Sato ............... H04B 10/07955 |
| 2002/0067299 A1 | 6/2002 | Clark et al. |
| 2012/0213531 A1* | 8/2012 | Nazarathy ............ H03M 1/145 |
| | | 398/202 |
| 2015/0003825 A1 | 1/2015 | Zhou |

OTHER PUBLICATIONS

Mandridis, et al., "A feedforward system for dynamic equalization of a chirped laser source suitable for photonic analog-to-digital conversion," Enabling Photonics Technologies for Defense, Security, and Aerospace Applications V, Proc. of SPIE, 7339: 733904-1-733904-1, doi: 10.1117/12.820686; (2014).

WIPO Application No. PCT/US2017/019345, International Preliminary Report on Patentability, dated Aug. 28, 2018.

* cited by examiner

HIGH-SPEED, HIGH-RESOLUTION, PHOTONIC-BASED ANALOG-TO-DIGITAL CONVERTER

CROSS REFERENCE TO RELATED APPLICATIONS

This application is a national phase entry of International Application No. PCT/US2017/019345 filed on Feb. 24, 2017, which claims the benefit of priority to U.S. provisional patent application 62/300,723 filed on Feb. 26, 2016, both entitled "High-Speed, High-Resolution, Photonic-Based Analog-to-Digital Converter", the contents of which are incorporated herein by reference in its entirety.

TECHNICAL FIELD

The present application relates to the technical field of photonic devices, and in particular, to a photonic analog-to-digital converter.

BACKGROUND OF INVENTION

High-speed, high-resolution analog-to-digital converters (ADCs) have been the subject of much research for years. Such systems would allow for digitization directly from the output of a broadband antenna, the implementation of software defined radio into higher bands of operation, and many other measurement, control and communications applications.

Photonic ADCs have been considered. An overview of the state-of-the-art in photonic ADCs as of 2007 can be found in George C. Valley, Photonic analog-to-digital converters, OPTICS EXPRESS, Vol. 15, No. 5 Mar. 2007, pp. 1955-1982.

Some prior approaches to the design of a photonic ADC use electro-optic modulators to achieve speed, but sometimes in impractical ways. For example, a fundamental design parameter of an electro-optic cell is its interaction length L. Some approaches for an N-bit ADC use modulators with interaction lengths that vary as $L, 2L, 4L, \ldots, 2^N L$. This practically limits the ADC resolution to 4 to 6 bits, since achieving this interaction length disparity would require a prohibitively high system complexity, size and cost for a large number of bits N. Further, the longer the cell the slower its speed. The loss also becomes impractically large for applications with long interaction lengths.

Other prior approaches avoid the interaction length disparity by using modulators of a fixed length. But an N-bit ADC requires a large quantity ($2^N$) of such modulators with the RF signal driving each of them. Therefore, these approaches are only practical for applications with a small number of bits, with for example N of 6 or less.

BRIEF SUMMARY OF INVENTION

According to some embodiments, a photonic feedforward analog-to-digital converter is provided. The photonic feedforward analog-to-digital converter (ADC) may include an optical source configured to produce a source optical signal having a value of a characteristic. A modulator comprising an optical input, an optical output and an electrical signal input, may be configured to receive the source optical signal at the optical input of the modulator and provide at the optical output of the modulator a modulated optical signal. The modulated optical signal may have a value of the characteristic that is changed relative to the value of the characteristic of the source optical signal based on the electrical signal. The feedforward ADC may have a plurality of stages, each of the plurality of stages comprising a stage optical input, a stage optical output, and a digital output. Each stage may be configured to set the value of the digital output based on the value of the characteristic of an optical signal at the stage optical input relative to a stage threshold value; and provide at the stage optical output an optical signal having the value of the characteristic of the optical signal at the stage optical input selectively modified based on the relative value of the characteristic of the optical signal at the stage optical input and the stage threshold value. The plurality of stages are coupled together in an order, with a stage optical input of a first of the plurality of stages coupled to the optical output of the modulator. For each of the plurality of stages, other than the first of the plurality of stages, the stage optical input is coupled to the stage optical output of a preceding stage in the order.

According to some embodiments, a method of operating a photonic feedforward analog-to-digital converter is provided. The method may include modulating a source optical signal based on an analog electronic signal to produce a modulated optical signal. The modulated optical signal may have a value of a characteristic that is changed relative to the value of the characteristic of the source optical signal based on the analog electronic signal. The method may include in each stage of a plurality of stages setting the value of a digital output of the stage based on the value of the characteristic of an optical signal input to the stage relative to a stage threshold value. The optical signal input to a first stage of the plurality of stages may be the modulated optical signal. The method may include selectively modifying the characteristic of the optical signal input to the stage based on the value of the characteristic of the optical signal input relative to the stage threshold value; feeding forward the selectively modified optical signal as an input to a subsequent stage of the plurality of stages; combining the values of the digital output of the plurality of stages to produce a converted digital equivalent value of the analog electronic signal.

According to an embodiment, a photonic feedforward analog-to-digital converter is provided. The photonic feedforward analog-to-digital converter may include an optical source configured to produce a source optical signal having a state of polarization. A modulator comprising an optical input, an optical output and an electrical signal input is configured to receive the source optical signal at the optical input of the modulator and provide at the optical output of the modulator a modulated optical signal. The modulated optical signal may have a state of polarization that is changed relative to the state of polarization of the source optical signal based on the electrical signal. The feedforward ADC may have a plurality of stages, each of the plurality of stages comprising a stage optical input, a stage optical output, and a digital output. Each stage may be configured to set the value of the digital output based on the state of polarization of an optical signal at the stage optical input relative to a stage threshold value; and provide at the stage optical output an optical signal having the state of polarization of the optical signal at the stage optical input selectively modified based on the relative value of the state of polarization of the optical signal at the stage optical input and the stage threshold value. The plurality of stages are coupled together in an order, with a stage optical input of a first of the plurality of stages coupled to the optical output of the modulator. For each of the plurality of stages, other than the first of the plurality of stages, the stage optical input is coupled to the stage optical output of a preceding stage in the order.

The foregoing is a non-limiting summary of the invention, which is defined by the appended claims.

DETAILED DESCRIPTION OF INVENTION

Figure 1:
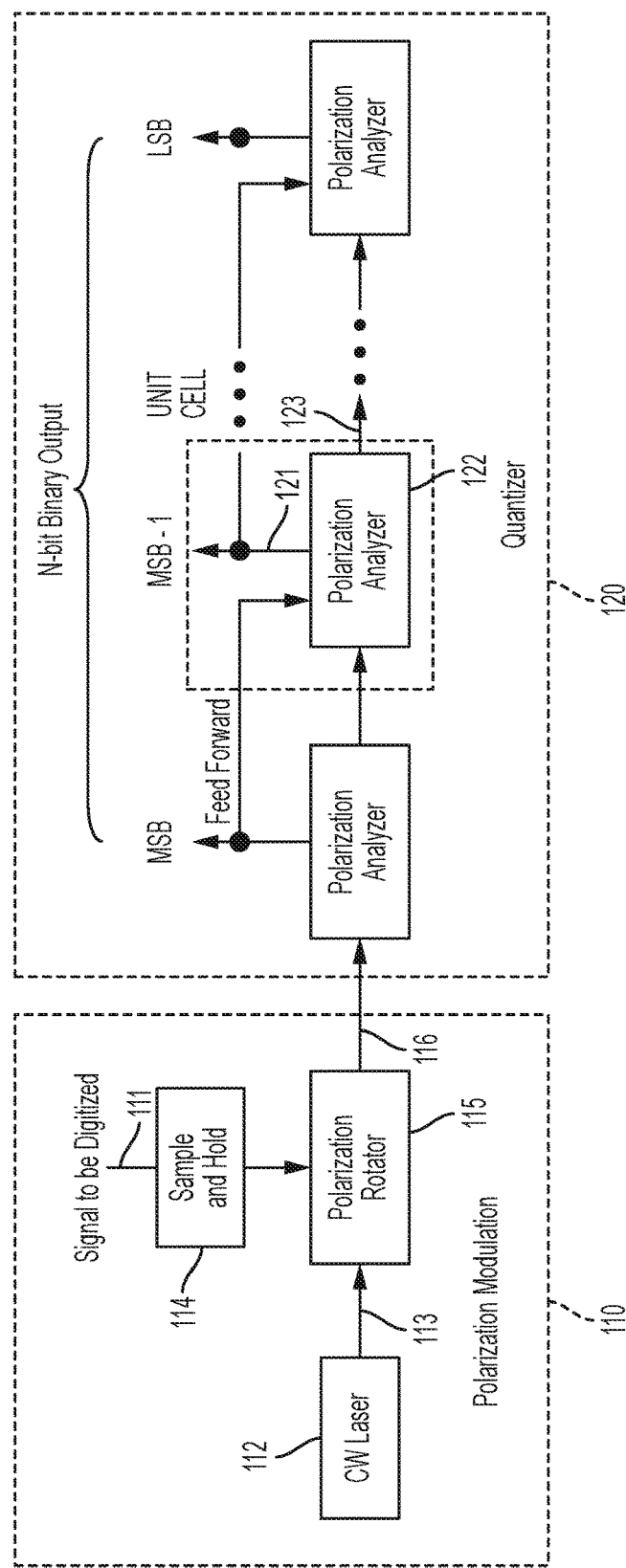
FIG. 1 is a schematic diagram of a photonic feedforward analog-to-digital converter.

Disclosed here is a new approach for a photonic ADC that offers several notable advantages when compared with prior approaches. In some embodiments, the photonic ADC may use only one high-speed electro-optic modulator driven by a signal to be digitized. The modulator may alter the value of a characteristic of a source optical signal based on the value of a signal to be digitized, which may be an electrical signal. In the examples described herein, that characteristic is polarization.

Accordingly, in some embodiments, the high-speed electro-optic modulator may be a Pockels Cell used to control wave polarization using the electro-optic effect. In such an embodiment, high speed is achieved by taking advantage of the fundamental property of a Pockels Cell to control wave polarization using the electro-optic effect. Specifically a linearly polarized wave has its state of polarization (SOP) varied as it travels through the cell in a way that is linearly proportional to the applied voltage. This fundamental property is known to be useful in making a high-speed phase and amplitude modulator.

Disclosed here is an architecture for a new type of photonic ADC, one that has the potential to operate at speeds significantly faster than other photonic or electronic ADCs. The overall system differs from other electro-optic-based approaches in several important ways.

In some embodiments, the signal to be digitized is applied to only one electro-optic (EO) modulator. In other electro-optic-based approaches, the high-speed signal to be digitized must be directed to multiple, in some cases many EO modulators. Such high-speed signal distribution adds complexity and limits overall performance. By directing the signal to only one EO modulator, these limitations are generally avoided. Some embodiments disclosed here use only one high-speed modulator driven by the signal to be digitized. This avoids the difficult practical problem of distributing exact replicas of the signal to be digitized to multiple modulators. The disclosed approach may also use a single input polarization modulator to vary the SOP over the range of [0, π/2] radians using a reasonable voltage level.

In some embodiments, the system may use linear optical components but in the framework of a nonlinear architecture. Specifically employed in some embodiments is a feedforward approach. Once a bit is determined, its state (i.e., a logical zero or one) is fed forward to the next least significant bit and the information is used to aid in the determination of the next lower bit. In this feedforward architecture, the binary state of the higher-order bits, once determined, is used to bias the SOP of the signal and aid in the determination of subsequent lower-order bits. This nonlinear feedforward aspect of the ADC provides simplicity of its architecture.

In accordance with some embodiments, this feedforward architecture is implemented with a plurality of stages, coupled in an order, with later stages in the order receiving an optical input that is the optical output of the preceding stage in the order. The first stage in the order may receive its optical input from the output of the EO modulator. Each stage may provide a digital output, representing one bit of the digitized word representing the electrical input.

The simplicity of the architecture along with the type of components used in its implementation makes it suitable for implementation as a Photonic Integrated Circuit (PIC). In some embodiments, the optical system uses one continuous wave laser operating at a monochromatic wavelength as an optical source, and the entire system can be realized in the form of a photonic integrated circuit. When manufactured in this way, the ADC would occupy a small volume compatible with any system requiring their use.

Some embodiments include two sub-systems: the first is polarization rotation 110, followed by a polarization analysis component 120. In the embodiment illustrated, the polarization analysis component 120 acts as a quantizer, producing a digital output 121 having a value based on the polarization of the signal 111 (FIG. 1). FIG. 1 also illustrates a plurality of stages 122 in a feedforward configuration to the next stage in an order. In such an embodiment, the polarization analysis component 120 may also generate an output signal 123 that is fed forward to the next stage. The output signal 123 may have a polarization that is selectively modified based on the value of the digital output 121.

In some embodiments, an optical source is provided to produce a source optical signal. As one example, the optical source may be a monochromatic continuous wave laser 112 that outputs a source optical signal 113 with a single state of polarization.

As used herein, "monochromatic" would be understood by one of skill in the art to mean that substantially all of the signal energy is concentrated at one wavelength. For example, greater than 95% of the signal energy is within +/−5% of a nominal wavelength. However, it should be appreciated that optical sources may, in some embodiments, have greater spectral purity, such as greater than 98% of the signal energy within +/−3% of a nominal wavelength. Likewise, a "single state of polarization" would be understood by one of skill in the art to mean substantially all of the signal energy is at the nominal polarization, such as greater than 95% of the signal energy is within +/−5% of a nominal polarization. However, it should be appreciated that optical sources may, in some embodiments, have greater purity, such as greater than 98% of the signal energy within +/−3% of a nominal state of polarization.

In some embodiments, the signal to be digitized 111 is generally first directed to a Sample-and-Hold (S/H) circuit 114 that maintains the sampled voltage level constant for the time required to produce its binary representation.

Also in some embodiments, front-end electronics (not shown in FIG. 1) may be required for input signal conditioning such as sign-bit extraction, scaling, level shifting, and the like.

In some embodiments, the analog signal to be digitized, appropriately scaled and held constant by the S/H, is used to control a high-speed electro-optic polarization rotator (PR) 115. The PR 115 may be a commercial product, realized with fundamental optical components, or implemented as a photonic integrated circuit.

In the example of FIG. 1, the PR 115 maps the input signal level 111 to a unique state of polarization (SOP) 116 in the range [0, π/2]. The generation of the corresponding binary word thus becomes one of resolving this SOP 116, which is the function of the quantizer portion 120 of the system.

Figure 2:
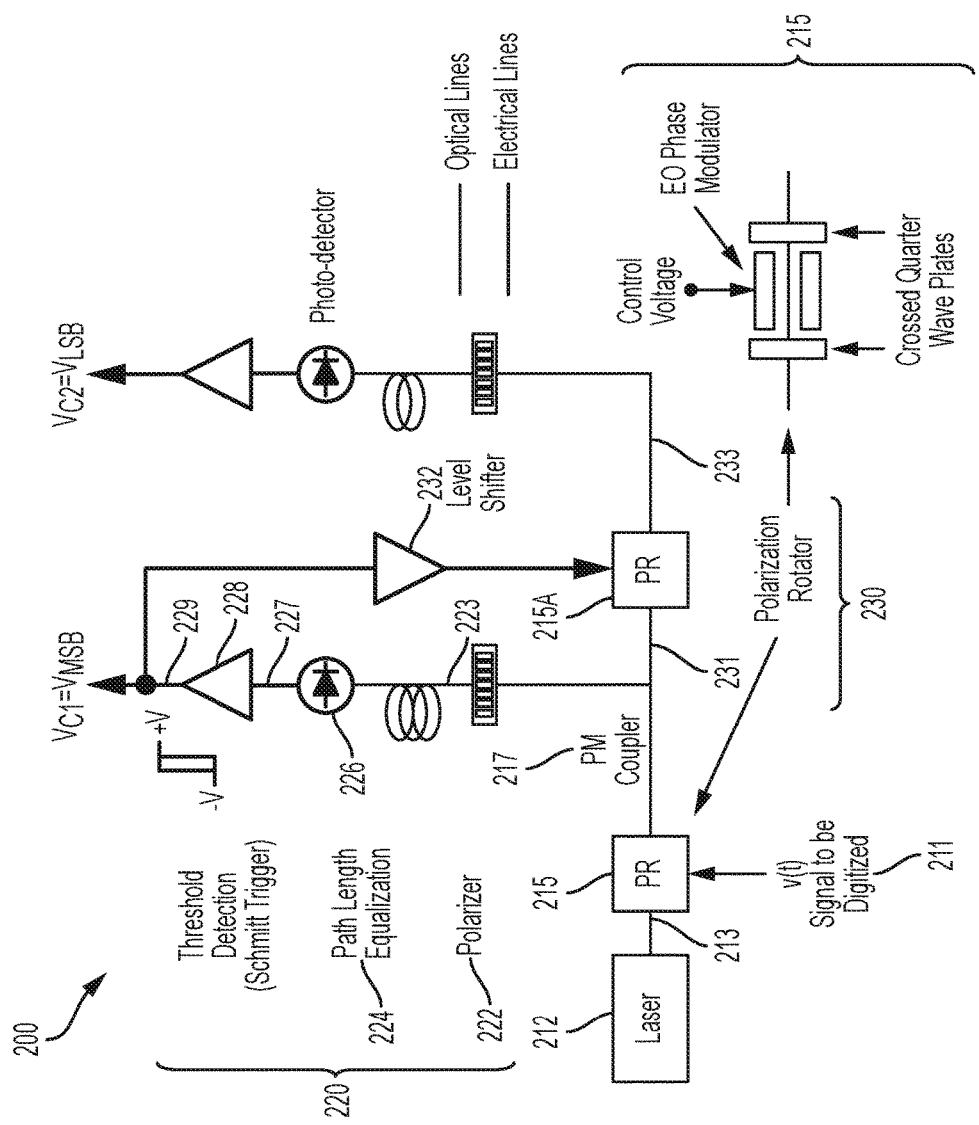
FIG. 2 is a schematic diagram of an example photonic feedforward analog-to-digital converter embodiment as a 2-bit ADC.

In one aspect, the basic operation of the ADC can be described by the example embodiment of a 2-bit ADC. With this example, the extension to an N-bit system is straightforward. A 2-bit ADC 200 is shown in FIG. 2 along with the associated polarization states shown in FIG. 3.

In this example embodiment, a laser source 212 is horizontally or x-polarized. The signal to be digitized 211, $v_{in}(t)$, appropriately conditioned as mentioned above, drives an electro-optic polarization rotator 215 thereby altering the SOP of the input 213 from initial horizontal state to:

$$\vec{P}_n(v_{in}) = [\hat{x} P_x + \hat{y} P_y] = [\hat{x} \cos{[(\varphi(v_{in})]} + \hat{y} \sin{[\varphi(v_{in})]}], \quad \text{(Eqn. 1)}$$

wherein $\hat{x}$ and $\hat{y}$ are unit vectors, and $$\varphi_1(v_{in}) = \frac{\pi}{2} \frac{v_{in}}{V_{FS}}, \quad 0 \le v_{in} \le V_{FS}, \quad \text{(Eqn. 2)}$$

wherein $V_{FS}$ is the full scale voltage which results in a 90-degree counter-clockwise rotation of the SOP.

In some embodiments, a polarization maintaining (PM) coupler 217 taps off a portion of the output light of the electro-optic polarization rotator 215 and directs it to an optoelectronic circuit 220 consisting of a polarizer 222, photodetector 226 and comparator 228 that establishes the binary digit for the first or Most Significant Bit (MSB) as follows.

The polarizer 222 may be oriented at an angle orthogonal to the SOP of the laser 212 and produces an intensity 223 that is proportional to the SOP of the incident light. This intensity 223 is detected by the photodetector 226 and the detected electrical voltage 227 sent to a fast regenerative comparator 228, preferably a Schmitt trigger. If the intensity level is above a specified threshold level the comparator output 229 has a value of +V corresponding to a logical one for the MSB. Similarly, if the intensity level is below the threshold level, the comparator output 229 has a value of −V corresponding to a logical zero for the MSB.

In some embodiments, after the MSB is established with its state voltage being either ±V, its digital output value 229 is then fed forward and used to establish the next bit, or the LSB in the 2-bit ADC example embodiment. The SOP diagrams shown in FIGS. 3(a)-3(d) illustrate how this feed forward is accomplished. For a 2-bit ADC, there are four quantization regions for the SOP corresponding to the four possibilities for a binary word in FIGS. 3 (a) through 3(d), respectively.

Figure 3A:
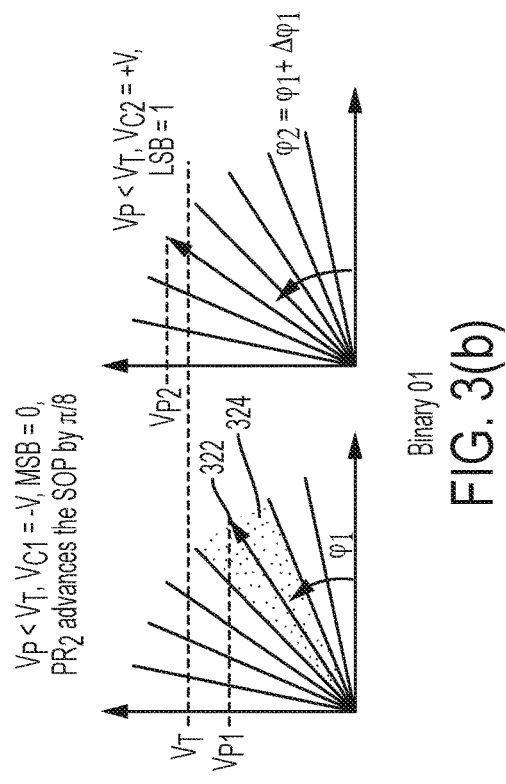
FIGS. 3(a) to 3(d) are diagrams showing polarization states for the 2-bit ADC example embodiment of FIG. 2 at different quantization levels.

In the embodiment illustrated in the example in FIG. 3(a), an SOP 312 that falls in the quantization range 314 (shaded region) corresponds to binary 00. With the polarizer oriented as discussed, this SOP would result in detected voltage $V_{P1}$ that is below the comparator threshold $V_T$, resulting in an output voltage of −V volt or a logical zero for the MSB. This information may be fed forward by selectively changing the state of polarization of the optical signal that will be passed to the next stage, which is used to establish the next lower bit. The polarization state signal $\vec{P}_{in}$ ($v_{in}$) is now directed to a second PR 215A, which either advances or retards the SOP by a fixed amount depending on the state of the previously established bit. In this embodiment, the state of the previously established bit may be used to modify the SOP within a stage 230. The SOP of the optical signal at the stage optical input 231 may be selectively modified based on the value of the SOP of the optical signal at the stage optical input 231 relative to the stage threshold value. For the example illustrated in FIG. 3(a), since $V_{P1} < V_T$, we advance the SOP counter-clockwise by π/8 radians. The level shifter 232 shown adjusts the MSB voltage level ±V such that the second PR 215A produces this proper SOP rotation. For the situation shown in FIG. 3(a), the SOP, advanced (counter-clockwise) by π/8 radians, results in a SOP 233 that when processed by the polarizer-detector pair still results in a voltage level $V_{P2}$ below threshold, so the LSB is also a logical zero.

Figure 3B:
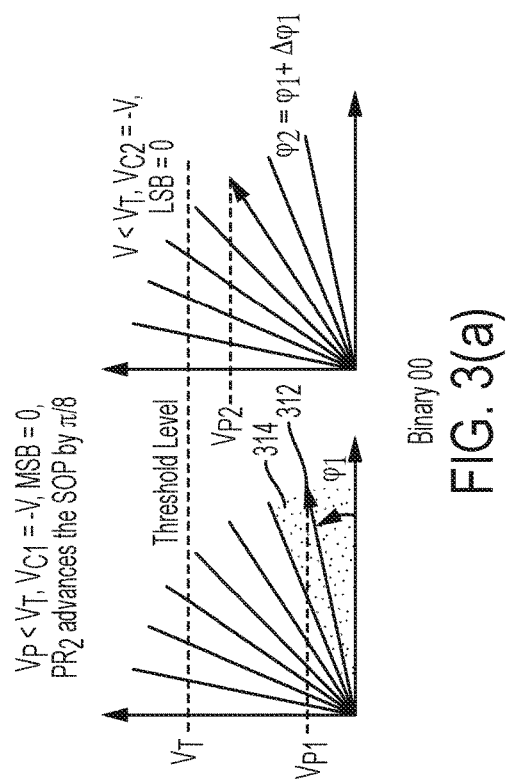

FIG. 3(b) shows another example embodiment with an input SOP 322 that falls in the second quantization range 324. In this example also, the detected signal $V_{P1}$ falls below threshold resulting in a logical zero for the MSB. This time, however, advancing the SOP by π/8 radians results in a detected voltage level $V_{P2}$ that is above $V_T$, corresponding to a logical one for the LSB.

Figure 3C:
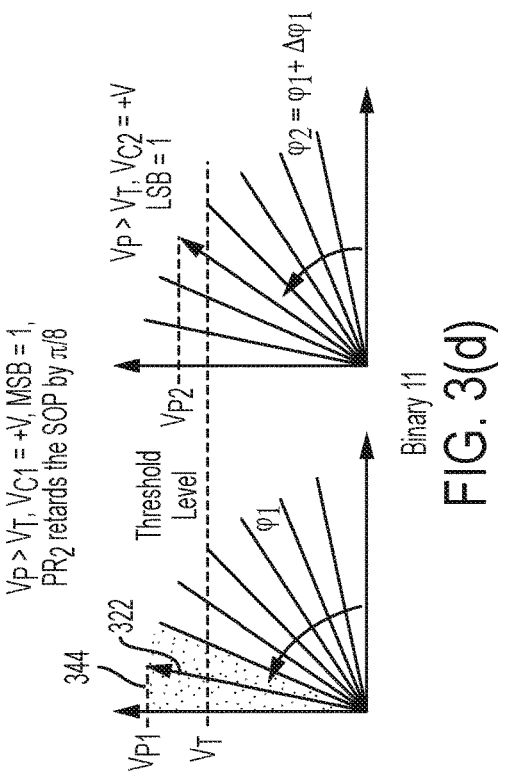

FIG. 3(c) shows an example embodiment with an input SOP 332 falling in the third quantization range 334. The detected voltage level is above threshold ($V_{P1} > V_T$) corresponding to a logical one for the MSB. The second PR retards the SOP by π/8 radians, placing the detected voltage $V_{P2} < V_T$ below threshold resulting in a logical zero for the LSB.

Figure 3D:
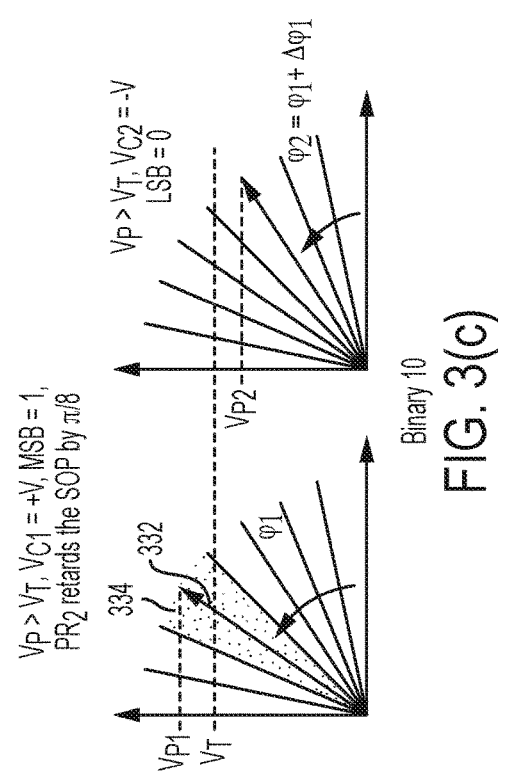

FIG. 3(d) shows an example embodiment where input SOP 342 is in the fourth quantization range 344. For this case both $V_{P1}$ and $V_{P2}$ are above the threshold level $V_T$ resulting in the binary word 11.

Figure 4:
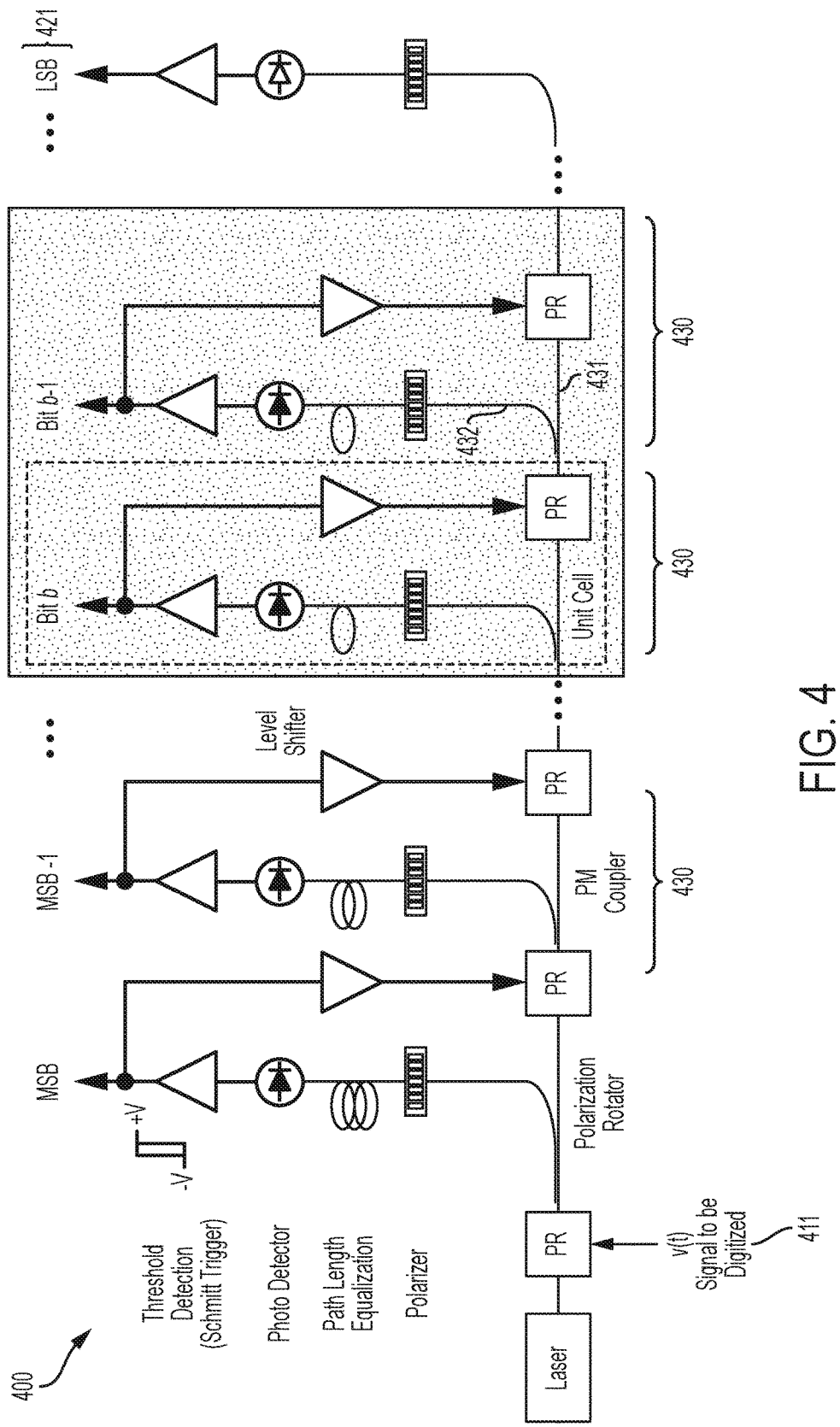
FIG. 4 is a schematic diagram of an example photonic feedforward analog-to-digital converter embodiment as an N-bit ADC.

It should be appreciated that an ADC converter may be constructed with any number of stages. Extending the 2-bit ADC to an N-bit ADC 400 may result in a cascade of unit cells 430 as shown in FIG. 4. In some embodiments, the coupler splitting ratio may be selected so that each bit leg 431, 432 has equal power.

In some embodiments, all optical components (couplers, modulators, waveguides/fibers) of a photonic ADC are of the polarization maintaining type.

According to one aspect of the invention, to avoid ambiguity with the electronic comparator when the input voltage falls very near the threshold value, a regenerative comparator, such as Schmitt trigger, may be used. In some embodiments, each bit leg may also contain an excess length of waveguide for path length equalization 224 ensuring that each bit appears at the output at the same time.

According to some embodiments, the MSB (bit-N) level for an N-bit ADC is determined from the input SOP in a manner similar to the two-bit system described. The input PR, driven by the S/H circuit rotates the laser's SOP and the MSB is determined prior to feeding forward the rotated signal as an input to a subsequent PR. For each successive bit, additional PR may modify the SOP by an amount such that $$\varphi_b(v_{in}) = \varphi_1(v_{in}) + \sum_{i=2}^{b} \frac{\pi}{2^{i+1}} sgn(V_{i-1}). \quad \text{(Eqn. 3)}$$

In some embodiments, for a horizontally polarized input laser the binary level for bit $B_b$ may be determined from the threshold operator $$B_b(v_{in}) = V_o sgn\left[\sin(\varphi_b(v_{in})) - \frac{1}{\sqrt{2}}\right],\quad \text{(Eqn. 4)}$$

where $V_o$ is an arbitrarily selected voltage level and sgn[x] is the signum function $$sgn[x] = \begin{cases} 1, & x > 0 \\ -1, & x < 0 \end{cases}.\quad \text{(Eqn. 5)}$$

FIG. 4 is a schematic diagram of an example photonic feedforward analog-to-digital converter embodiment as an N-bit ADC 400. In this embodiment, combining the values of the digital output $B_b$ of the plurality of stages 430 may produce a converted N-bit digital equivalent value 421 of the analog electronic signal 411.

Figure 5:
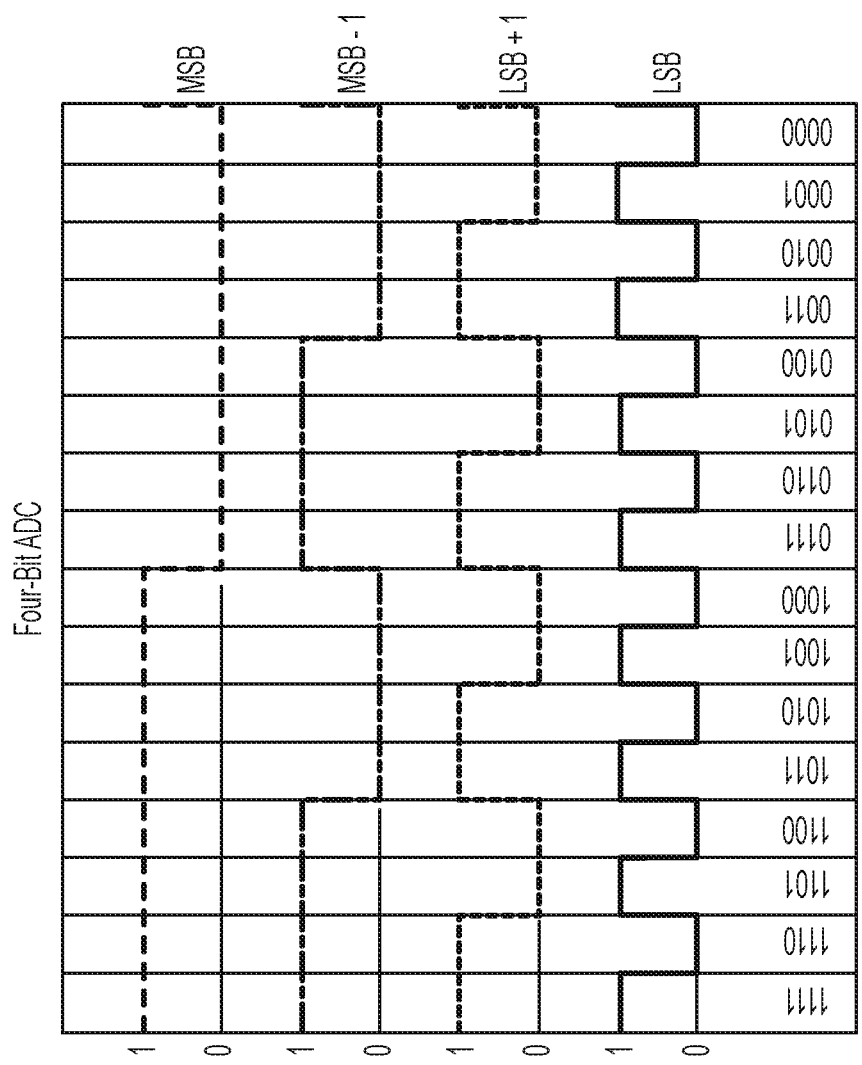
FIG. 5 is simulated results for a 4-bit ADC embodiment of the invention.

Using the equations provided in the example embodiments above, a mathematical simulation of a four-bit ADC may produce the result 500 shown in FIG. 5.

Having thus described several aspects of at least one embodiment of this invention, it is to be appreciated that various alterations, modifications, and improvements will readily occur to those skilled in the art.

For example, a state of polarization was described as the value of a characteristic of the source optical signal being modulated in the photonic ADC. The same approach may be applied to other characteristics of optical signal such as phase and/or intensity. Also, a feedforward ADC architecture was used to illustrate the photonic ADC operation. In the aforementioned embodiment, with the exception of a first of the plurality of stages, the plurality of stages are coupled together in an order and a stage optical input is coupled to the stage optical output of a preceding stage in the order. It should be appreciated that any suitable arrangement of the plurality of stages and coupling between the plurality of stages, with the exception of the first of the plurality of stages, may be used.

Moreover, the analog electronic signal may be a signal from a sensor. In another example, the analog electronic signal may be a signal transmitted and/or received in a software-defined radio.

The number of bits N may be any suitable value, such as 6, 7, 8, 9, 10, 11, 12, 13, 14, 15, or 16. The number of bits N may comprise a value greater than 16, in some embodiments. The speed of operation of the ADC may comprise for example a value of 1 Gsps, 5 Gsps, 10 Gsps, 50 Gsps. The speed of operation of the ADC may comprise a value of greater than 100 Gsps.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the attached claims, various elements are recited in different claims. However, the claimed elements, even if recited in separate claims, may be used together in any suitable combination.

What is claimed is:

1. A photonic feedforward analog-to-digital converter, comprising:
   an optical source configured to produce a source optical signal having a value of a characteristic;
   a modulator comprising an optical input, an optical output and an electrical signal input, wherein the modulator is configured to receive the source optical signal at the optical input of the modulator and provide at the optical output of the modulator a modulated optical signal, wherein the modulated optical signal has a value of the characteristic that is changed relative to the value of the characteristic of the source optical signal based on the electrical signal;
   a plurality of stages, each of the plurality of stages comprising a stage optical input, a stage optical output, and a digital output;
   wherein each of the plurality of stages is configured to:
   set the value of the digital output based on the value of the characteristic of an optical signal at the stage optical input relative to a stage threshold value, wherein the value of the characteristic is a state of polarization; and
   provide at the stage optical output an optical signal having the value of the characteristic of the optical signal at the stage optical input, selectively modified based on a relative value of the characteristic of the optical signal at the stage optical input and the stage threshold value;
   wherein:
   the plurality of stages is coupled together in an order;
   a stage optical input of a first of the plurality of stages is coupled to the optical output of the modulator; and
   for each of the plurality of stages, other than the first of the plurality of stages, the stage optical input is coupled to the stage optical output of a preceding stage in the order.

2. The photonic feedforward analog-to-digital converter of claim 1, wherein:
   the modulator comprises an electro-optic modulator.

3. The photonic feedforward analog-to-digital converter, comprising:
   an optical source configured to produce a source optical signal having a value of a characteristic;
   a modulator comprising an optical input, an optical output and an electrical signal input, wherein the modulator is configured to receive the source optical signal at the optical input of the modulator and provide at the optical output of the modulator a modulated optical signal, the modulated optical signal having a value of the characteristic that is changed relative to the value of the characteristic of the source optical signal based on the electrical signal;

a plurality of stages, each of the plurality of stages comprising a stage optical input, a stage optical output, and a digital output;
wherein each of the plurality of stages is configured to:
set the value of the digital output based on the value of the characteristic of an optical signal at the stage optical input relative to a stage threshold value; and
provide at the stage optical output an optical signal having the value of the characteristic of the optical signal at the stage optical input selectively modified based on the relative value of the characteristic of the optical signal at the stage optical input and the stage threshold value;
wherein the plurality of stages is coupled together in an order;
wherein a stage optical input of a first of the plurality of stages is coupled to the optical output of the modulator;
wherein for each of the plurality of stages, other than the first of the plurality of stages, the stage optical input is coupled to the stage optical output of a preceding stage in the order; and
wherein each of the plurality of stages further comprises a polarization rotator to provide, at the stage optical output, an optical signal having the state of polarization of the optical signal at the stage optical input selectively rotated, based on the relative value of the state of polarization of the optical signal at the stage optical input and the value of the stage threshold value.

4. A method of operating a photonic feedforward analog-to-digital converter, comprising:
modulating a source optical signal based on an analog electronic signal to produce a modulated optical signal, the modulated optical signal having a value of a characteristic that is changed relative to the value of the characteristic of the source optical signal based on the analog electronic signal, wherein the value of the characteristic comprises a state of polarization;
in each stage of a plurality of stages:
setting the value of a digital output of the stage, based on the value of the characteristic of an optical signal input to the stage relative to a stage threshold value, wherein the optical signal input to a first stage of the plurality of stages is the modulated optical signal;
selectively modifying the characteristic of the optical signal input to the stage based on the value of the characteristic of the optical signal input relative to the stage threshold value;
feeding forward the selectively modified optical signal as an input to a subsequent stage of the plurality of stages; and
combining the values of the digital output of the plurality of stages to produce a converted digital equivalent value of the analog electronic signal.

5. The method of claim 4, wherein:
modulating a source optical signal comprises modulating a source optical signal using an electro-optic modulator.

6. The method of claim 4, wherein:
selectively modifying the characteristic of the optical signal input comprises selectively modifying a state of polarization of the optical signal input using a polarization rotator.

7. A photonic feedforward analog-to-digital converter, comprising:
an optical source configured to produce a source optical signal having a state of polarization;
a modulator comprising an optical input, an optical output and an electrical signal input, wherein the modulator is configured to receive the source optical signal at the optical input of the modulator, and provide at the optical output of the modulator a modulated optical signal, the modulated optical signal having a state of polarization that is changed relative to the state of polarization of the source optical signal based on the electrical signal;
a plurality of stages, each of the plurality of stages comprising a stage optical input, a stage optical output, and a digital output;
wherein each of the plurality of stages is configured to:
set the value of the digital output based on the state of polarization of an optical signal at the stage optical input relative to a stage threshold value; and
provide at the stage optical output an optical signal having the state of polarization of the optical signal at the stage optical input selectively modified, based on the relative value of the state of polarization of the optical signal at the stage optical input and the stage threshold value,
wherein:
the plurality of stages is coupled together in an order;
a stage optical input of a first of the plurality of stages is coupled to the optical output of the modulator; and
for each of the plurality of stages, other than the first of the plurality of stages, the stage optical input is coupled to the stage optical output of a preceding stage in the order.

8. The photonic feedforward analog-to-digital converter of claim 7, wherein:
the optical source is a continuous wave laser.

9. The photonic feedforward analog-to-digital converter of claim 7, wherein:
the source optical signal is monochromatic.

10. The photonic feedforward analog-to-digital converter of claim 7, wherein:
the modulator comprises an electro-optic modulator.

11. The photonic feedforward analog-to-digital converter of claim 7, further comprising: a sampling device configured to receive and provide a sample of the electrical signal to the electrical signal input of the modulator.

12. The photonic feedforward analog-to-digital converter of claim 11, wherein:
the sampling device comprises a sample and hold circuit.

13. The photonic feedforward analog-to-digital converter of claim 7, wherein:
each of the plurality of stages further comprises a polarizer in connection with a photodetector for detecting the value of the state of polarization of the optical signal at the stage optical input.

14. The photonic feedforward analog-to-digital converter of claim 7, wherein:
each of the plurality of stages further comprises a comparator in connection with the photodetector, wherein the comparator is configured to set the value of the digital output based on the relative value of a photodetector output relative to a stage threshold value.

15. The photonic feedforward analog-to-digital converter of claim 14, wherein:
the comparator is a Schmitt trigger.

16. The photonic feedforward analog-to-digital converter of claim 7, wherein:
each of the plurality of stages further comprises a polarization rotator to provide, at the stage optical output, an optical signal having the state of polarization of the optical signal at the stage optical input selectively rotated, based on the relative value of the state of polarization of the optical signal at the stage optical input and the value of the stage threshold value.

17. The photonic feedforward analog-to-digital converter of claim 16, wherein:
the polarization rotator comprises an electro-optic modulator.

18. The photonic feedforward analog-to-digital converter of claim 16, wherein:
each of the plurality of stages further comprises a polarization maintaining coupler for coupling the polarizer and the polarization rotator with the stage optical input.

* * * * *